(12) United States Patent
Maunuksela et al.

(10) Patent No.: US 8,077,799 B2
(45) Date of Patent: Dec. 13, 2011

(54) APPARATUS AND METHOD TO ADJUST A PHASE AND FREQUENCY OF A DIGITAL SIGNAL

(75) Inventors: Jaako Maunuksela, Espoo (FI); Jussi Vepsäläinen, Helsinki (FI); Mika Kahola, Masala (FI)

(73) Assignee: Nokia Corporation, Espoo (FI)

( * ) Notice: Subject to any disclaimer, the term of this patent is extended or adjusted under 35 U.S.C. 154(b) by 809 days.

(21) Appl. No.: 12/081,549

(22) Filed: Apr. 17, 2008

(65) Prior Publication Data

US 2009/0213972 A1  Aug. 27, 2009

(30) Foreign Application Priority Data

Feb. 21, 2008 (FI) .................................... 20085158

(51) Int. Cl.
*H04L 25/49* (2006.01)
(52) U.S. Cl. ........ 375/296; 375/295; 375/299; 375/300; 375/306; 375/350; 455/42; 455/73
(58) Field of Classification Search .................. 375/135, 375/136, 146, 268, 285, 295, 296, 297, 300, 375/302, 322, 259, 260, 267, 271, 299
See application file for complete search history.

(56) References Cited

U.S. PATENT DOCUMENTS

| 7,974,593 | B2 * | 7/2011 | Cole et al. ................... 455/114.3 |
| 2003/0161487 | A1 * | 8/2003 | Husted et al. ................. 381/94.5 |
| 2005/0048938 | A1 * | 3/2005 | Sahota ........................ 455/127.3 |
| 2008/0164917 | A1 * | 7/2008 | Floyd et al. .................... 327/117 |
| 2009/0074106 | A1 * | 3/2009 | See et al. ........................ 375/297 |
| 2009/0201084 | A1 * | 8/2009 | See et al. .......................... 330/51 |
| 2011/0026565 | A1 * | 2/2011 | Rofougaran ................... 375/136 |
| 2011/0037403 | A1 * | 2/2011 | DeVincentis et al. ......... 315/248 |

* cited by examiner

*Primary Examiner* — Shuwang Liu
*Assistant Examiner* — Hirdepal Singh
(74) *Attorney, Agent, or Firm* — Squire, Sanders & Dempsey (US) LLP

(57) ABSTRACT

An apparatus comprising at least two controllers each providing control information for controlling phase or frequency of a digital signal, a combiner for combining control information from the at least two controllers to combined control information and a phase rotator for adjusting, by using phase rotation, one or more of the phase and the frequency of the digital signal on the basis of the combined control information.

15 Claims, 2 Drawing Sheets

APPARATUS AND METHOD TO ADJUST A PHASE AND FREQUENCY OF A DIGITAL SIGNAL

FIELD OF THE INVENTION

The invention relates to an apparatus, a method associated with the apparatus, and a computer program product to adjust at least one of the phase and frequency of a digital signal. More particularly, the phase and frequency are adjusted based on combined control information from at least two sources of control information for adjustment of phase or frequency.

BACKGROUND OF THE INVENTION

There are many commonly needed functions in a transmitter digital front-end, each requiring phase rotation of an in-phase/quadrature phase (I/Q) signal. Such functions are frequency correction of the signal, mixing of the signal to intermediate frequency, phase correction according to signal amplitude level (AM/PM) correction in pre-distortion functions, and conversion of PM signal to a constant envelope phase modulated I/Q signal in a polar transmitter, for instance.

Accurate I/Q vector rotations are computationally heavy operations and thus require a considerable amount of silicon area and power.

SUMMARY OF THE INVENTION

In one aspect, there is provided an apparatus comprising at least two controllers each configured to provide a control information for controlling phase or frequency of a digital signal, a combiner configured to combine control information from the at least two controllers to combined control information, and a phase rotator configured to adjust, by using phase rotation, one or more of the phase and the frequency of the digital signal on the basis of combined control information.

In another aspect, there is provided a mobile station comprising at least two controllers each configured to provide control information for controlling phase or frequency of a digital signal, a combiner configured to combine control information from the at least two controllers to combined control information, and a phase rotator configured to adjust one or more of the phase and the frequency of the digital signal by using phase rotation on the basis of the combined control information.

In still another aspect, there is provided an apparatus comprising means for providing first control information for adjustment of phase or frequency of a digital signal, means for providing second control information for adjustment of phase or frequency of a digital signal, means for combining first and second control information to combined control information, and means for rotating at least one of the phase and the frequency of the digital signal by using phase rotation on the basis of the combined control information.

In still another aspect, there is provided a method, comprising providing first control information for adjustment of phase or frequency of a digital signal, providing second control information for adjustment of phase or frequency of a digital signal, combining first and second control information to combined control information, and rotating at least one of the phase and the frequency of the digital signal by using phase rotation on the basis of the combined control information.

In still another aspect, there is provided a computer program product comprising software code portions for executing a method, comprising providing first control information for adjustment of phase or frequency of a digital signal, providing second control information for adjustment of phase or frequency of a digital signal, combining first and second control information to combined control information, and rotating at least one of the phase and the frequency of the digital signal by using phase rotation on the basis of the combined control information.

BRIEF DESCRIPTION OF THE DRAWINGS

In the following, the invention will be described in greater detail by means of preferred embodiments with reference to the accompanying drawings, in which.

DETAILED DESCRIPTION OF A PREFERRED EMBODIMENT

Figure 1:
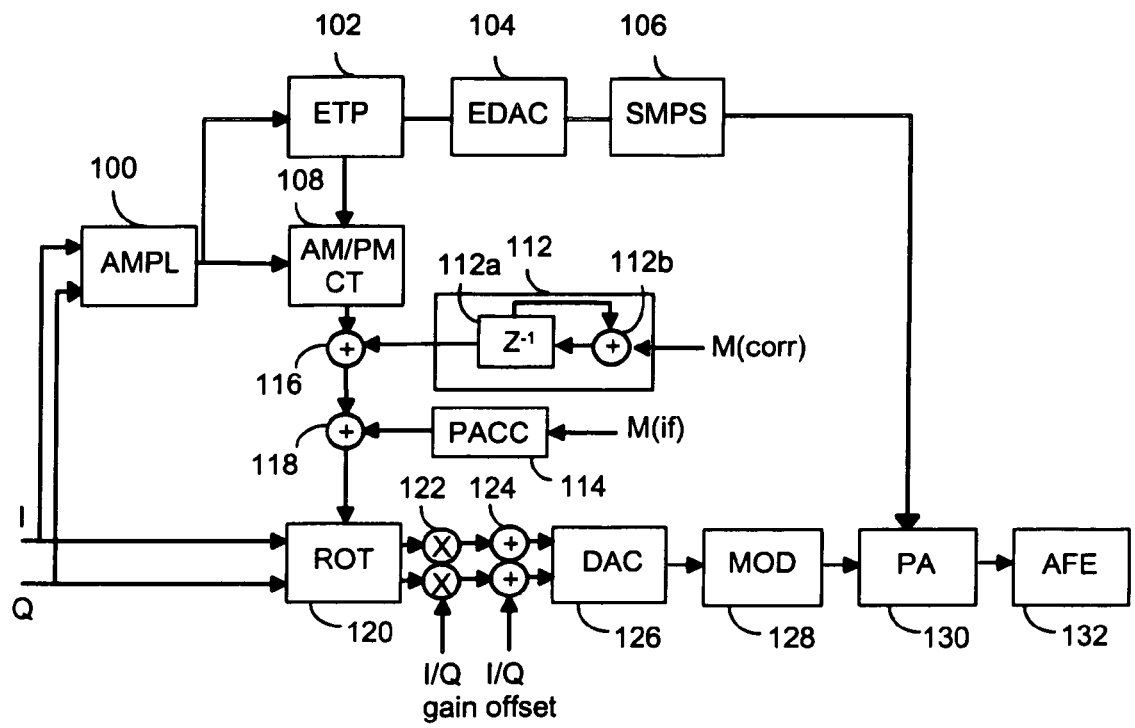
FIG. 1 shows an embodiment of an apparatus to perform adjustment of at least one of the phase and frequency.

FIG. 1 shows an embodiment of an apparatus. The apparatus of FIG. 1 may be employed in a mobile station, for instance.

The units 100 to 108 relate to AM/PM correction in a transmitter. In 100, the I/Q-signal's envelope or amplitude of the I/Q-signals may be computed by taking a square-root of the sum of the squares of the digital I- and Q-signals, or by using lookup table based amplitude calculation, for instance. The output is forwarded to an envelope tracking path unit 102, an envelope digital-to-analog converter 104, and a switched mode power supply (SMPS) 106. The output of the unit 100 is fed to an AM/PM correction unit 108 where it may be multiplied with a gain correction factor.

The envelope tracking path unit 102 provides an envelope signal that follows the original amplitude with a predefined accuracy. Predistortion curves, or practically values representing predistortion values, may be stored in a lookup table in the correction unit 108. A selection of the appropriate curve may be carried out by the envelope tracking path unit providing the correction unit 108 with a binary number referring to a desired predistortion curve in a correction table of the correction unit 108. At the same moment, the amplitude calculation unit 100 may provide a binary number referring to an amplitude value, which refers to the single value at the selected curve. The envelope signal and amplitude signals together are used to point a predistortion or AM/PM phase correction value which compensates for power amplifier phase behavior due to envelope tracking functionality at the given envelope and amplitude value. The output to a combiner 116 from a register may be a phase shift value that is needed to shift the I- and Q-signals.

The above functionality thus relates to correction of power amplifier nonlinear behavior in a transmitter. Another functionality in the transmitter ongoing simultaneously with the AM/PM phase correction is frequency correction illustrated by a unit 112. When the mobile station transmits an uplink signal, a base station receiving the signal may detect that there is a need to correct the frequency of the uplink signal. The base station may indicate in downlink signaling to the mobile station the need for frequency correction, and also an indication as to how the frequency should be corrected, that is whether the frequency should be increased or decreased and how much it should be adjusted.

The phase accumulator 112 may take as an input a binary number M(corr) referring to a frequency register, and output the frequency correction signal. The phase accumulator includes an adder circuit 112b and a register 112a. The adder 112b has two inputs, a frequency correction word M(corr) and a feedback signal from the register 112a output. The feedback signal and the frequency correction word may be added up in each clock cycle. The output signal is a sawtooth waveform whose frequency is determined by the clock frequency and an increment word according to equation (1).

$$f_{out} = \frac{M}{2^n} f_{CLK}, \quad (1)$$

where
M is a binary input word
$2^n$ is the width of the adder
$f_{OUT}$ is the output frequency, and
$f_{CLK}$ is the clock frequency.
If the desired frequency change is smaller than (2)

$$\frac{f_{CLK}}{2^n}, \quad (2)$$

the correction word may be "1". Then, for instance, a counter may add "1" to the accumulator at each fourth clock cycle, giving a frequency ¼ of the original frequency.

The combiner 116 may thus input phase information both from the AM/PM correction unit for correcting the phase relating to AM/PM functions, and from the accumulator 112 for correcting transmit frequency in a transmitter. The input to the combiner from the accumulator 112 is thus a sawtooth waveform whose frequency represents the desired frequency due to the frequency correction. The input from the correction unit 108 may be a 14-bit binary word for adjusting the phase of the signal. When these two pieces of information are combined, the outcome is an adjusted sawtooth waveform.

The transmitter may also be equipped with an intermediate frequency generation functionality for performing a frequency change from baseband to intermediate frequency. The input to a phase accumulator 114 is a binary tuning word M(if) giving the intermediate frequency. The phase accumulator operates according to the same principles as the phase accumulator 112 disclosed above. Thus, the phase accumulator outputs a sawtooth waveform whose frequency is representative of the desired intermediate frequency.

The outputs of the combiner 116 and the accumulator 114 are combined in a combiner 118. The combiner 118 outputs the combined control information to adjust the input I- and Q-signals in a rotator 120. The combination information may include both frequency and phase change information. The frequency of the sawtooth waveform defines the frequency to be applied in the rotator 120, and the form of the sawtooth waveform defines the phase correction to be applied to the input IQ-signals. It may be that only one of these adjusting components is present in an incoming signal. If the incoming signal to the rotator 120 is only for frequency adjustment, the input signal is a pure sawtooth waveform. On the other hand, if the input signal is only for phase adjustment, the input signal is an arbitrary phase correction signal whose form depends on incoming I/Q signals and predistortion values.

The phase rotator 120 inputs the original I- and Q-signals and the combined phase adjustment information from the combiner 118. The phase rotator may use a CORDIC (Coordinate Rotation Digital Computer) algorithm, for instance, to adjust the phase and/or the frequency of the I- and Q-signals.

Thus, as explained above, also the frequency of a signal may be corrected/adjusted by phase shifting. In phase rotation, by rotating a phase vector clockwise, the frequency of the signal may be increased, and by rotating the vector counter-clockwise, the frequency may be decreased. The time between the peaks of the sawtooth-waveform determines the duration of one frequency cycle when full amplitude corresponds to 2*pi phase rotation.

Figure 2:
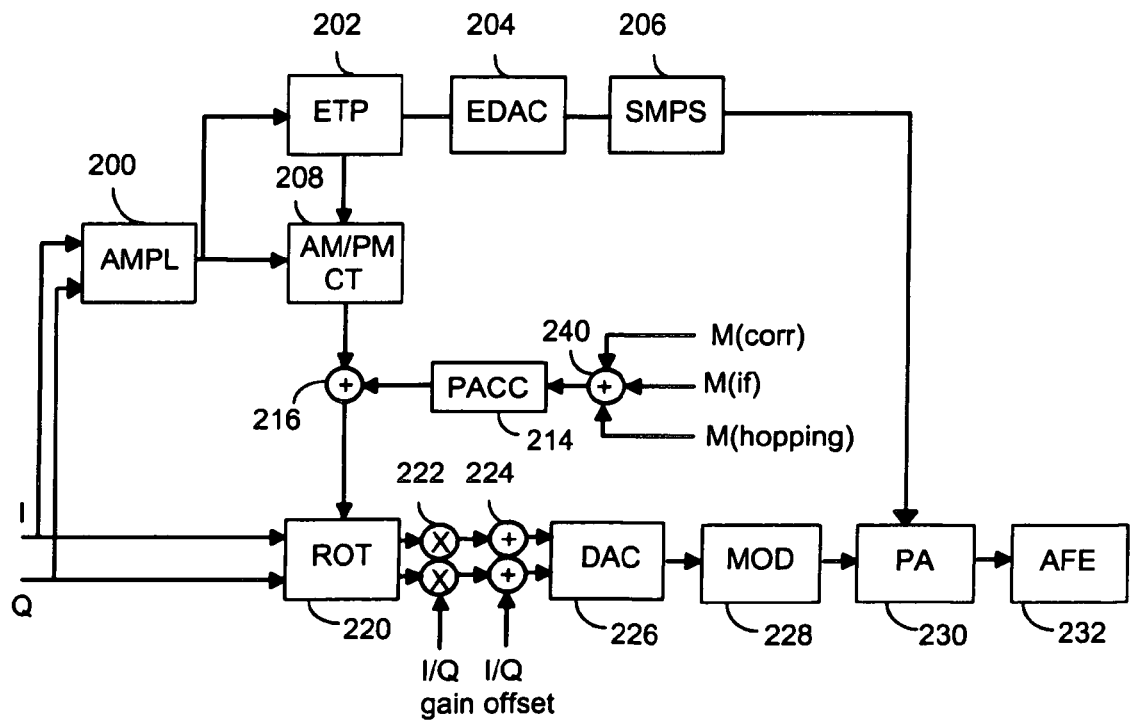
FIG. 2 shows another embodiment of an apparatus to perform adjustment of at least one of the phase and frequency.

I/Q gain and offset balancing are processed in respective units 122 and 124. The signals are then converted to analog signals in a digital-to-analog converter 126, modulated a in modulator 128, and amplified in amplifier 130 before forwarding to an antenna unit 132. FIG. 2 shows another embodiment of an apparatus. For most of the units, the embodiment of FIG. 2 corresponds to that of FIG. 1. The difference between the figures lies mainly in a second combiner 240, which combines all the frequency-related tuning words by summing them up thus providing a sawtooth wave having a greater frequency. FIG. 2 shows three such factors, M(corr) for frequency correction, M(if) for baseband-IF conversion, and M(hopping) for frequency-hopping originating frequency change. The combiner 240 combines the phase adjustment factors from the different frequency-affecting functions and outputs a binary number to a frequency register in a phase accumulator 214. The phase accumulator 214 outputs to the combiner 216 a saw-tooth wave taking into account all the frequency affecting factors. In the embodiment of FIG. 2, only one phase accumulator 214 and one combiner 216 are needed instead of two corresponding units in FIG. 2. The input to a rotator 220 from the combiner 216 may be a combined control information which includes both phase and frequency information for rotation of the input I- and Q-signals.

Figure 3:
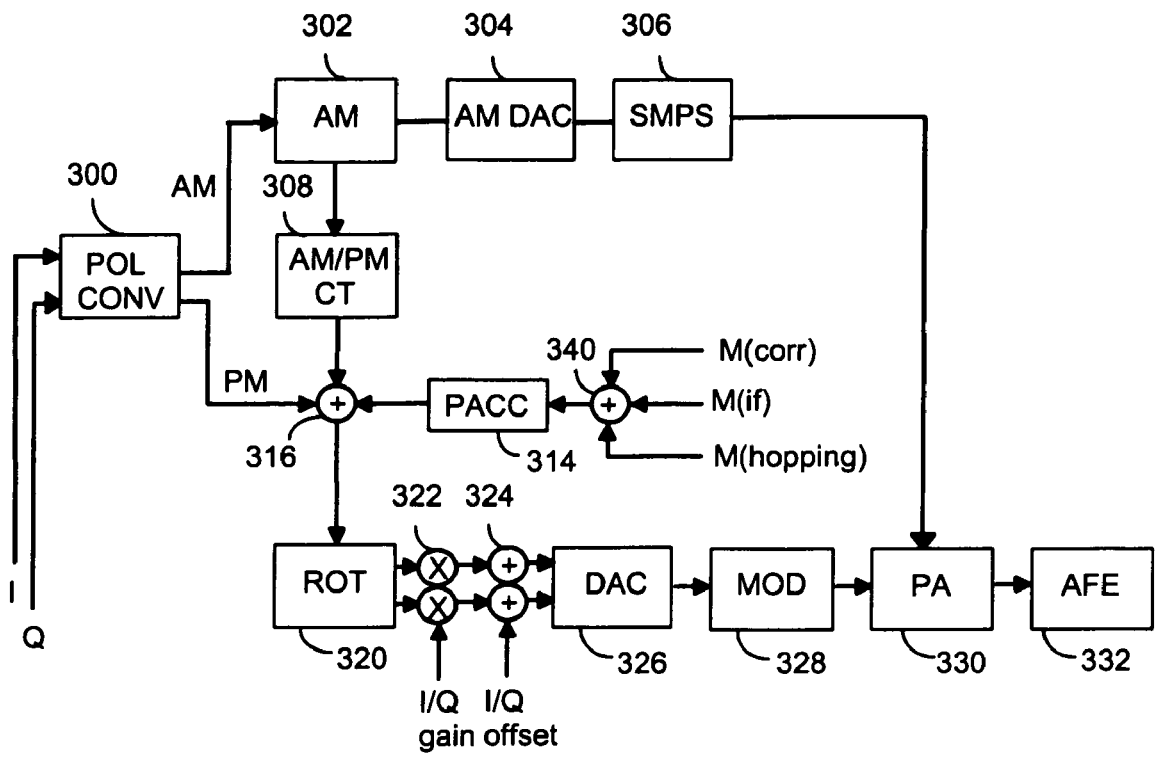
FIG. 3 shows still another embodiment of an apparatus to perform adjustment of at least one of the phase and frequency.

FIG. 3 shows another embodiment of a transmitter applicable in narrow-band systems like EDGE (Enhanced Data rates for Global Evolution). The embodiment of FIG. 3 includes a converter 300, which distributes the AM and PM modulation paths. Phase corrections may be added to the PM signal and this control information may be combined with other control information in the combiner 316 to provide combined control information. The combined control information may then be applied in the rotator to adjust the phase and/or frequency of the incoming signals.

Figure 4:
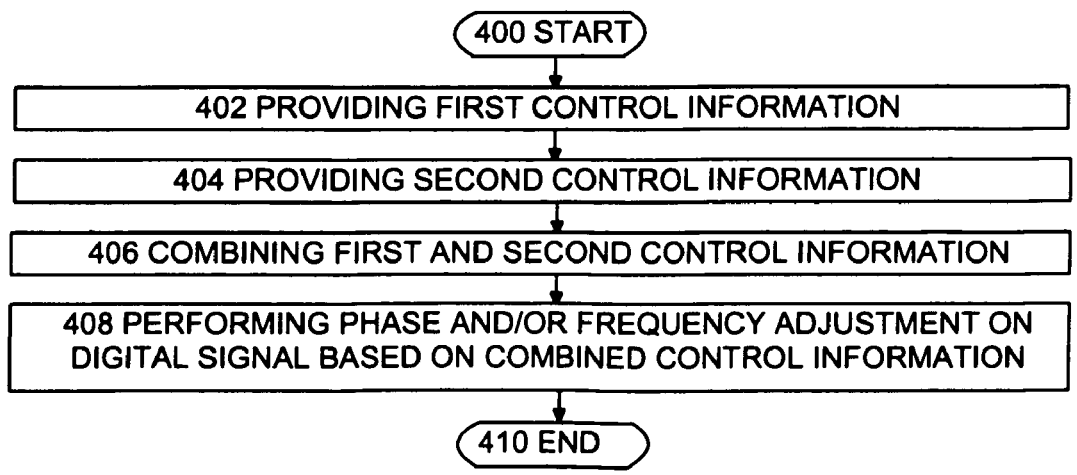
FIG. 4 shows an embodiment of a method to perform adjustment of at least one of the phase and frequency.

FIG. 4 shows an embodiment of a method. The method may be employed in a radio transmitter, such as a mobile station, for instance.

In 402, a first control parameter is provided. The first phase adjustment factor may originate from a first controller, such as a frequency correction functionality of the mobile station, for instance. When the mobile station transmits an uplink signal, a base station receiving the signal may detect that there is a need to adjust the frequency of the signal. The base station may provide the mobile station with an indication in downlink signaling that there is a need to adjust the uplink signal and how the signal should be adjusted. Upon reception of this information, the mobile station may provide a first control parameter. In practice, the first control parameter may be a sawtooth waveform having a desired frequency, thereby defining the frequency of the digital input I- and Q-signals.

In 404, a second control parameter is provided. The second control parameter may originate from a conversion from the baseband to intermediate frequency (IF), for instance. The conversion may be carried out in a similar manner to that explained in 402. In the adjustment, multiple rotations of the phase vector in the I/Q domain result in adjustment of the frequency of the signal.

Alternatively or in addition to, the second control information may include phase adjustment information only, without affecting the frequency of the signal. Such phase adjustment information may originate from an envelope tracking path, for instance.

In 406, first and second control information may be combined into combined control information. The control information may both affect the frequency of the signal, which is the case if they originate from baseband-to-IF conversion and frequency correction, for instance. Alternatively, one control information may be for adjustment of phase and one for adjustment of frequency. Although above reference has been made to combining two control information, there may be more of them.

In an embodiment, one or more frequency affecting phase factors, such as binary tuning words, are combined before combining them to frequency affecting control information.

In 408, the phase and/or frequency of the digital signal is adjusted by using the combined control information. The adjustment may be carried out by using CORDIC rotation or for instance. The input information to the CORDIC rotation may be a saw-tooth waveform whose frequency defines the frequency of IQ-rotations. The sawtooth waveform may be adjusted due to phase adjustment reasons, such as AM/PM correction. This shows in the IQ-rotation such that the phase angle of the rotation vector is changed.

An apparatus may include at least two controllers, each configured to provide control information for controlling phase or frequency of a digital signal. The controllers here refer to different entities in the transmitter. For instance, a controller may refer to the accumulator 112 or to the AM/PM correction unit 108 in FIG. 1. The control information provided by the accumulator may be the sawtooth waveform having a certain frequency depending on the input word to the accumulator. The control information provided by the AM/PM correction unit may be phase adjustment information. The combiner 116 in FIG. 1 combines these control information to combined control information, which is used in the rotator 120 to adjust the frequency and/or phase of the I- and Q-signals.

The embodiments may be implemented as a computer program by software, hardware, or a combination thereof. The implementation may be carried out on a radio frequency integrated circuit (RFIC) or on a signal or array processor.

It will be obvious to a person skilled in the art that, as technology advances, the inventive concept can be implemented in various ways. The invention and its embodiments are not limited to the examples described above but may vary within the scope of the claims.

The invention claimed is:

1. An apparatus, comprising:
a first controller configured to provide first control information to adjust a phase of a digital signal;
a second controller configured to provide second control information to adjust a frequency of the digital signal;
a first combiner configured to combine two or more frequency parameters into a combined frequency parameter, and provide the combined frequency parameter to the second controller;
a second combiner configured to combine the provided control information from the first controller and the second controller into combined control information; and
a phase rotator configured to adjust, by using phase rotation, the phase and the frequency of the digital signal on the basis of the combined control information.

2. The apparatus according to claim 1, wherein the rotator is configured to adjust at least one of the phase and the frequency of the digital signal by using in-phase/quadrature-phase vector rotation.

3. The apparatus according to claim 2, wherein the rotator is configured to apply a coordinate rotation digital computer algorithm in the in-phase/quadrature-phase vector rotation.

4. The apparatus according to claim 1, further comprising:
an envelope tracking transmitter configured to track a transmit envelope of the digital signal, wherein
one of the two controllers is coupled to the envelope tracking transmitter and configured to provide a phase factor to adjust the phase of the digital signal on the basis of the transmit envelope as the control information provided by said controller.

5. The apparatus according to claim 1, further comprising:
a polar transmitter configured to distribute amplitude modulation and phase modulation signal paths, wherein
one of the two controllers is coupled to the phase modulation signal path and configured to provide a phase factor to adjust the phase of the digital signal as the control information provided by said controller.

6. The apparatus according to claim 1, wherein one of the two controllers is configured to receive a frequency parameter indicating a frequency to be applied to the digital signal and to provide as control information a sawtooth waveform having a frequency indicated by the frequency parameter.

7. The apparatus according to claim 6, wherein the frequency parameter is one of a frequency correction parameter, an intermediate frequency parameter or a frequency hopping parameter.

8. A mobile station, comprising:
a first controller configured to provide first control information to adjust a phase of a digital signal;
a second controller configured to provide second control information to adjust a frequency of the digital signal;
a first combiner configured to combine two or more frequency parameters into a combined frequency parameter, and provide the combined frequency parameter to the second controller;
a second combiner configured to combine the provided control information from the first controller and the second controller into combined control information; and
a phase rotator configured to adjust the phase and the frequency of the digital signal by using phase rotation on the basis of the combined control information.

9. An apparatus, comprising:
first control means for providing first control information for adjustment of a frequency of a digital signal;
second control means for providing second control information for adjustment of the phase of the digital signal;
first combining means for combining two or more frequency parameters into a combined frequency parameter, and providing the combined frequency parameter to the first controller;
second combining means for combining the first and the second control information into combined control information; and
rotating means for adjusting the phase and the frequency of the digital signal by using phase rotation on the basis of the combined control information.

10. The apparatus according to claim 9, wherein the first control information comprises information for adjustment of the phase of the digital signal and the second control information comprises information for adjustment of the frequency of the digital signal.

11. The apparatus according to claim 9, further comprising:
parameter input means for inputting, to at least one of the first and second control means, a frequency parameter indicating a frequency to be applied to the digital signal, wherein at least one of the first and second control information has a sawtooth waveform having a frequency indicated by the frequency parameter.

12. A method, comprising:
providing first control information from a first controller to adjust a phase of a digital signal;
providing second control information from a second controller to adjust a frequency of the digital signal;
combining two or more frequency parameters into a combined frequency parameter and providing the combined frequency parameter to the second controller;
combining the first and the second control information into combined control information; and
adjusting the phase and the frequency of the digital signal by using phase rotation on the basis of the combined control information.

13. The method according to claim 12, further comprising:
inputting a frequency parameter indicating a frequency to be applied to the digital signal, wherein
at least one of the first and second control information has a sawtooth waveform having a frequency indicated by the frequency parameter.

14. A computer program embodied on a non-transitory computer-readable medium, the program controlling a processor to perform:
providing first control information from a first controller to adjust a phase of a digital signal;
providing second control information from a second controller to adjust a frequency of the digital signal;
combining two or more frequency parameters into a combined frequency parameter and providing the combined frequency parameter to the second controller;
combining the first and the second control information into combined control information; and
adjusting the phase and the frequency of the digital signal by using phase rotation on the basis of the combined control information.

15. The computer program according to claim 14, further controlling the processor to perform:
inputting a frequency parameter indicating a frequency to be applied to the digital signal, wherein at least one of the first and second control information has a sawtooth waveform having a frequency indicated by the frequency parameter.

* * * * *